United States Patent
Parikh et al.

(10) Patent No.: US 8,015,513 B2
(45) Date of Patent: Sep. 6, 2011

(54) OPC MODELS GENERATED FROM 2D HIGH FREQUENCY TEST PATTERNS

(75) Inventors: Ashesh Parikh, Frisco, TX (US); Willie J. Yarbrough, Sunnyvale, CA (US)

(73) Assignee: Texas Instruments Incorporated, Dallas, TX (US)

( * ) Notice: Subject to any disclaimer, the term of this patent is extended or adjusted under 35 U.S.C. 154(b) by 637 days.

(21) Appl. No.: 12/130,636

(22) Filed: May 30, 2008

(65) Prior Publication Data

US 2009/0300557 A1    Dec. 3, 2009

(51) Int. Cl.
G06F 17/50 (2006.01)

(52) U.S. Cl. .................. 716/53; 716/54; 716/55

(58) Field of Classification Search .................. 716/4, 5, 716/19–21, 54, 55, 53; 430/30
See application file for complete search history.

(56) References Cited

U.S. PATENT DOCUMENTS

2007/0031745 A1 *  2/2007  Ye et al. .......................... 430/30
2008/0178141 A1 *  7/2008  Sato ................. 716/19

* cited by examiner

*Primary Examiner* — Vuthe Siek
(74) *Attorney, Agent, or Firm* — John J. Patti; Wade J. Brady, III; Frederick J. Telecky, Jr.

(57) ABSTRACT

A method of generating a scalable OPC model for composing reticle pattern files from IC layouts using 2D test patterns is disclosed. The 2D test patterns include basic features which replicate features found in advanced ICs. Variations of feature dimensions and structure pitches provide measurement data which enables the scalability of the OPC model. A method of checking reticle pattern files for features which cannot be modeled by the scalable OPC model is also disclosed.

17 Claims, 7 Drawing Sheets

OPC MODELS GENERATED FROM 2D HIGH FREQUENCY TEST PATTERNS

FIELD OF THE INVENTION

This invention relates to the field of integrated circuits. More particularly, this invention relates to methods to improve photolithographic patterns used to fabricate integrated circuits.

BACKGROUND OF THE INVENTION

It is well known that feature sizes of advanced integrated circuits (ICs) are shrinking with each new fabrication technology node, requiring photolithographic patterns with increasingly higher resolution to form the IC features. The resolution of a photolithographic pattern is a function of the wavelength of the light and the optical lens in the photolithographic equipment used to expose photoresist to form the pattern. New illumination sources with reduced wavelengths have been introduced to produce photolithographic patterns with higher resolution, but the reduction trend in wavelength has not kept up with the shrink rate of IC features. Similarly, improvements in optical lenses in photolithographic equipment have not matched IC feature shrink rates. To maintain photolithographic pattern integrity, the reticle pattern is manipulated from the IC layout pattern, in a process commonly known as optical proximity correction (OPC), to account for optical interference effects during printing the photolithographic patterns. OPC schemes typically use one-dimensional pattern transfer functions and empirically measured pattern contours of selected structure-specific patterns. Generating reticle patterns for ICs using such OPC schemes is problematic, because IC layouts include complex features which are not adequately addressed by one-dimensional models and which do not match the available structure-specific features.

SUMMARY OF THE INVENTION

This Summary is provided to comply with 37 C.F.R. §1.73, requiring a summary of the invention briefly indicating the nature and substance of the invention. It is submitted with the understanding that it will not be used to interpret or limit the scope or meaning of the claims.

The instant invention provides a method of generating an optical proximity correction (OPC) model which uses two-dimensional (2D) test structures to support a scalable algorithm for generating reticle pattern elements that can accommodate complex IC layout features. Reticles produced with the inventive method are used to fabricate ICs containing components which include complex layout features. The inventive method is also capable of identifying features in an IC layout for which reticle pattern elements cannot be generated by the scalable OPC model which meet conformance criteria of a given photolithographic process.

An advantage of the instant invention is a scalable OPC model using measurements of patterned and etched 2D test patterns is enabled to generate reticle pattern elements which will produce photoresist patterns and etched structures which correspond more closely to desired contours of IC layout features.

DETAILED DESCRIPTION

Figure 1:
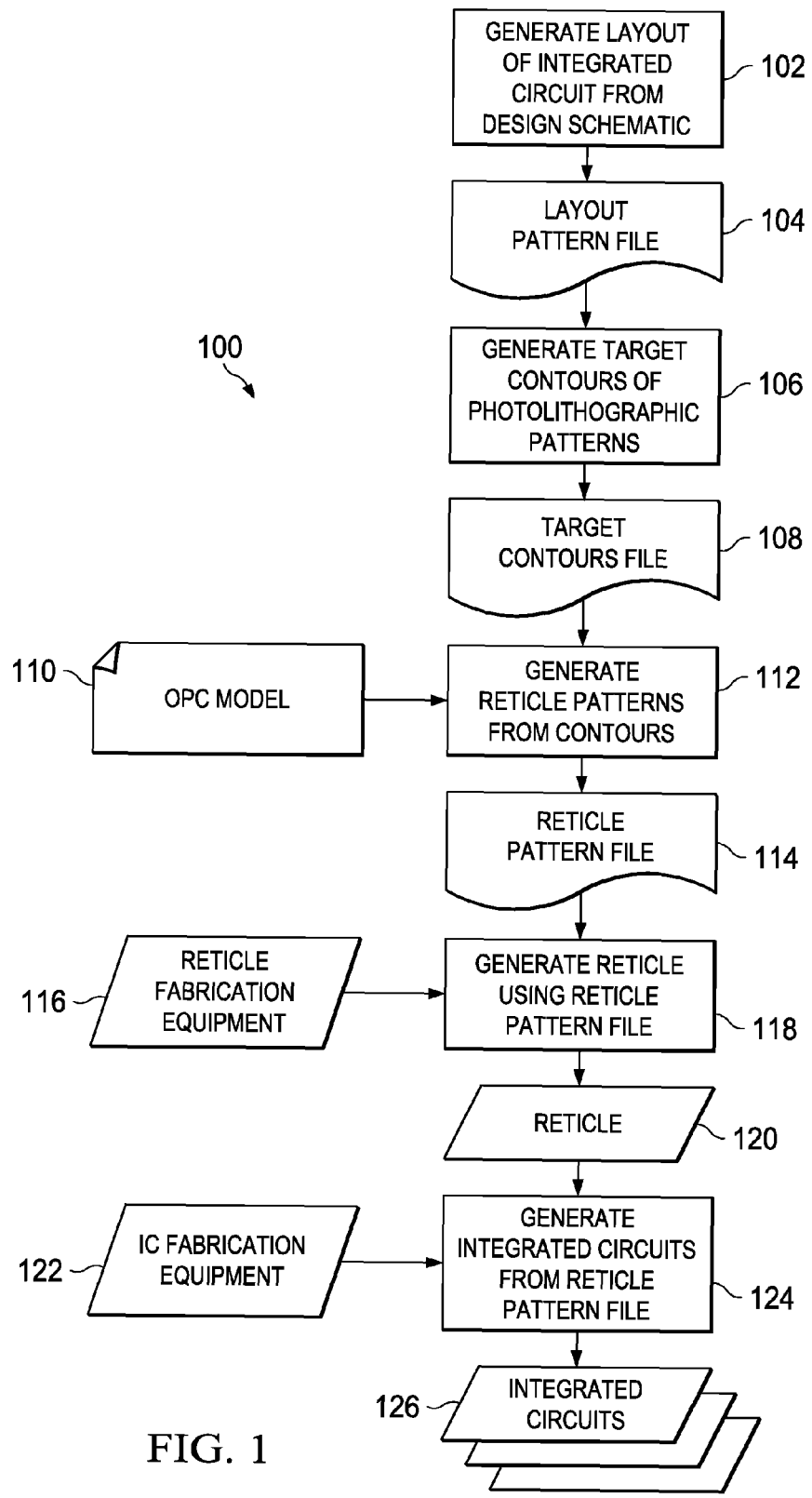
FIG. 1 is a flowchart (100) of the process of generating reticle pattern files from IC layouts using the inventive method.

The present invention is described with reference to the attached figures, wherein like reference numerals are used throughout the figures to designate similar or equivalent elements. The figures are not drawn to scale and they are provided merely to illustrate the invention. Several aspects of the invention are described below with reference to example applications for illustration. It should be understood that numerous specific details, relationships, and methods are set forth to provide a full understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The problem of creating a mathematical formalism of a two-dimensional (2D) optical proximity correction (OPC) model that can be used to generate reticle patterns for complex integrated circuit (IC) features is addressed by the instant invention, which provides a method of generating an OPC model which uses 2D test structures to calibrate a scalable algorithm for generating reticle pattern elements that can accommodate complex IC layout features. The reticle pattern elements are included in reticles which are in turn used to fabricate ICs containing components which are configured with complex layout features. The inventive method is also capable of identifying features in an IC layout for which reticle pattern elements cannot be generated by the scalable OPC model which meet conformance criteria of the photolithographic process.

The term contour in this disclosure is understood to mean a shape of a lateral boundary of a feature in a photoresist pattern or in an etched structure in an IC material layer. Target contours represent desired shapes of pattern structures while measured contours represent shapes of printed and/or etched pattern structures.

FIG. 1 is a flowchart (100) of the process of generating reticle pattern files from IC layouts using the inventive OPC model. In a first step (102), an IC layout is generated from IC design schematics, producing a layout pattern file (104). The layout pattern file (104) is used as input for a second step (106), in which target contours of layout features for a given photolithographic level are generated, producing a target contours file (108). The target contours file (108) and OPC model (110) are used as input for a third step (112), in which reticle patterns are generated using known methods, producing a reticle pattern file (114). The reticle pattern file (114) is used in conjunction with reticle fabrication equipment (116) in a fourth step (118), in which a reticle (120) is produced using known reticle fabrication methods. The reticle (120) is used in conjunction with IC fabrication equipment (122) in a fifth step (124), in which ICs (126) are fabricated using known IC fabrication methods. Profitable production of ICs requires the third step (112) to generate reticle pattern elements which may be printed during photolithographic operations to substantially match the target contours generated in the second step (106). In a preferred embodiment, the second step (106) and third step (112) are combined in a single computer program.

Figure 2:
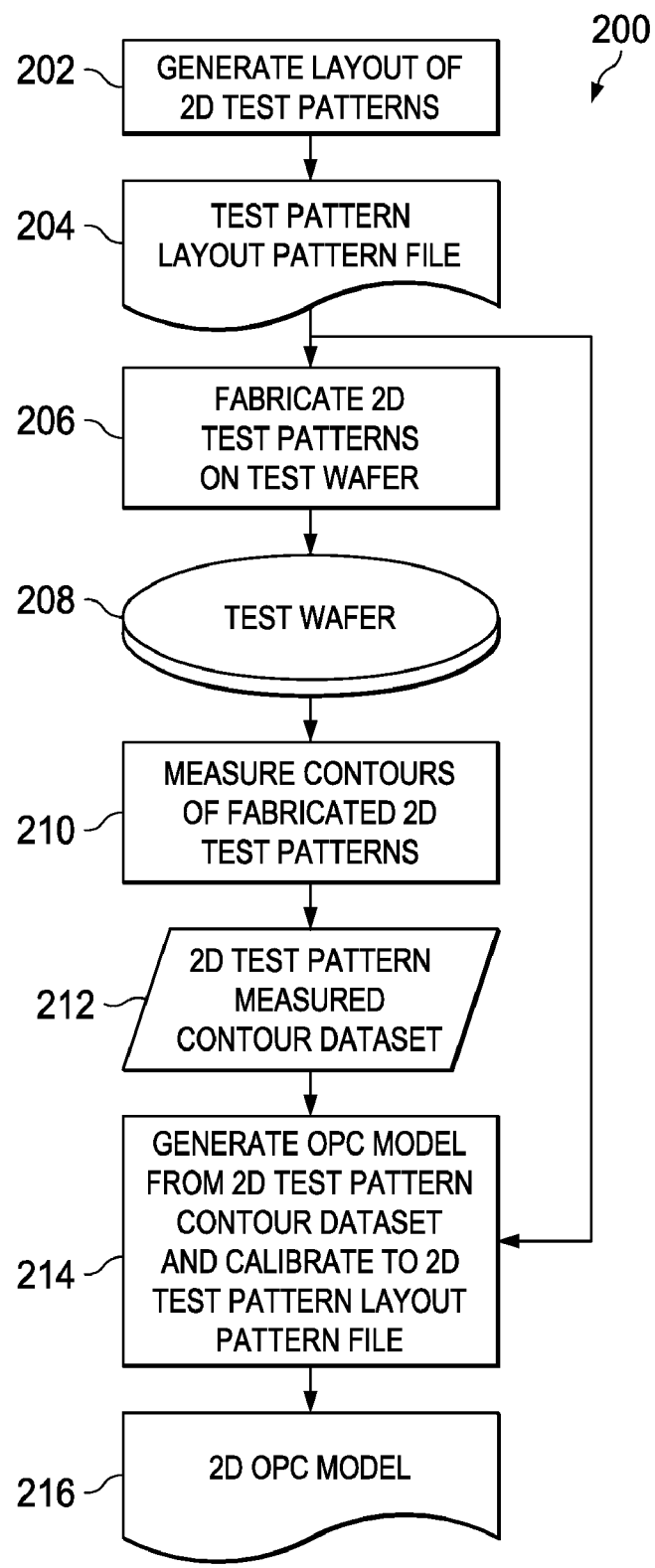
FIG. 2 is a flowchart (200) of the inventive method of generating an OPC model.

FIG. 2 is a flowchart (200) of the inventive method of generating a mathematically predictive 2D OPC model. In a first step (202), a layout of 2D test patterns is generated to produce a test pattern layout pattern file (204). The 2D test patterns include sets of patterns which reproduce systematic variations of features of ICs to be fabricated using the instant OPC model. The test pattern layout pattern file (204) is used in a second step (206) to produce a reticle which is subsequently used to fabricate a test wafer (208) containing photoresist patterns and etched structures of the 2D test patterns. In a third step (210), contours of the photoresist patterns and etched structures, generated for example by known scanning electron microscopy (SEM) or atomic force microscopy (AFM) methods, of the 2D test patterns are measured to produce a 2D test pattern measured contour dataset (212). In a fourth step (214), a computer algorithm reads the 2D test pattern measured contour dataset (212) and the test pattern layout pattern file (204), and produces a mathematically predictive and scalable OPC model (216) using known methods which can predict photoresist and etched structure contours of 2D features in IC layouts.

Figure 3A:
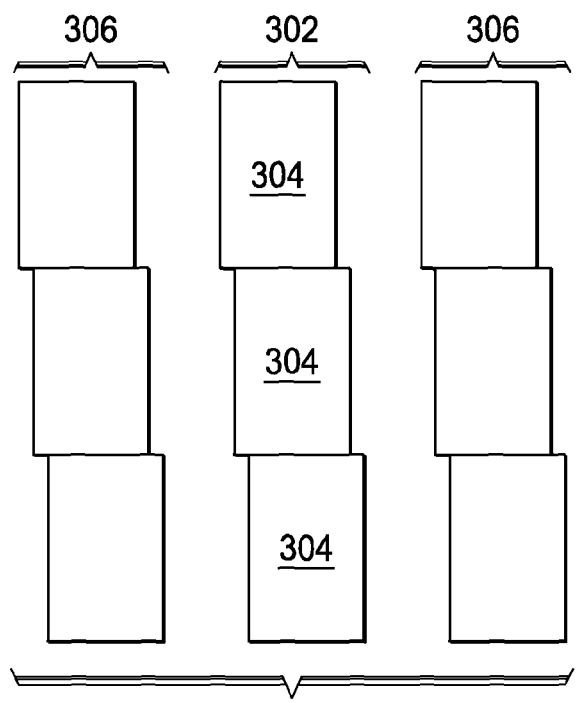
FIG. 3A through FIG. 3H depict examples of 2D test patterns which reproduce systematic variations of features found in IC layouts.
Figure 3B:
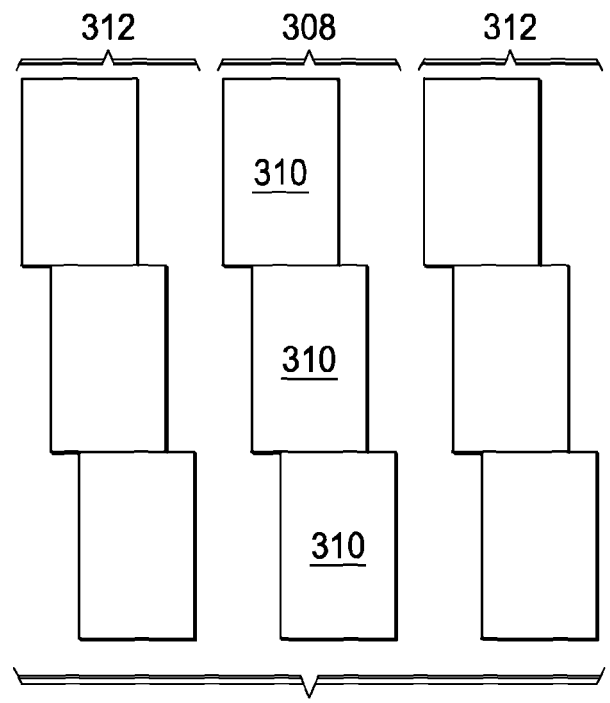

FIG. 3A through FIG. 3H depict examples of 2D test patterns which reproduce systematic variations of features found in IC layouts. Referring to FIG. 3A, a layout for a first slanted line (302) includes a first set of offset rectangles (304) to produce a desired slant angle and linewidth. The first slanted line (302) is surrounded by adjacent slanted lines (306) that reproduce dense circuit features in IC layouts. Referring to FIG. 3B, a layout for a second slanted line (308), which has a higher slant angle than the first slanted line (302) in FIG. 3A, includes a second set of offset rectangles (310) which have more lateral offset than the first set of offset rectangles (304) in FIG. 3A. The second slanted line (308) is also flanked by adjacent slanted lines (312) that reproduce dense circuit features in IC layouts. Comparing measured contours of photoresist and etched structure of the first and second slanted lines (302, 308) enables a computer program to generate the scalable OPC model to predict contours for any slanted line with a slant angle between the slant angle of the first slanted line (302) and the slant angle of the second slanted line (308). In a preferred embodiment, a layout of 2D test patterns includes sets of slanted lines with a variety of slant angles that comprehend a range of slant angles found in IC layouts, as well as a variety of linewidths and separations between adjacent lines. Furthermore, slanted and unslanted adjacent lines are included in separate layouts for slanted lines.

Figure 3C:
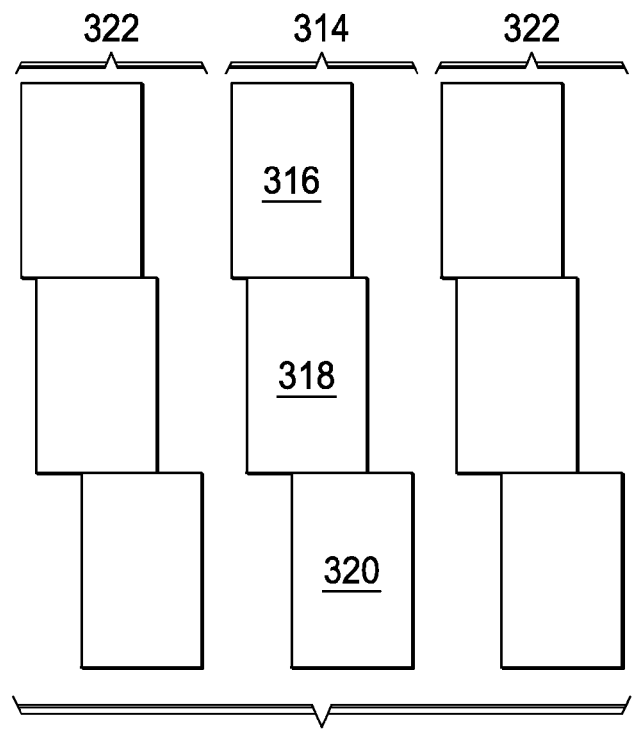

Referring to FIG. 3C, a layout for a first curved line (314) includes a first rectangle (316), a second rectangle (318) and a third rectangle (320). A lateral offset between the first rectangle (316) and the second rectangle (318) is less than a lateral offset between the second rectangle (318) and the third rectangle (320), to produce a desired curvature. The first curved line (314) is also flanked by adjacent curved lines (322) that reproduce dense circuit features in IC layouts. In a preferred embodiment, a layout of 2D test patterns includes sets of curved lines with a variety of curvatures that comprehend a range of curvatures found in IC layouts, as well as a variety of linewidths and separations between adjacent lines. Furthermore, curved and straight adjacent lines are included in separate layouts for curved lines. Comparing measured contours of photoresist and etched structure of curved lines from a preferred embodiment of a layout of 2D test patterns enables a computer program to generate the scalable OPC model to predict contours for any curved line with a curvature comprehended in the range of curvatures in the layout of 2D test patterns.

Figure 3D:
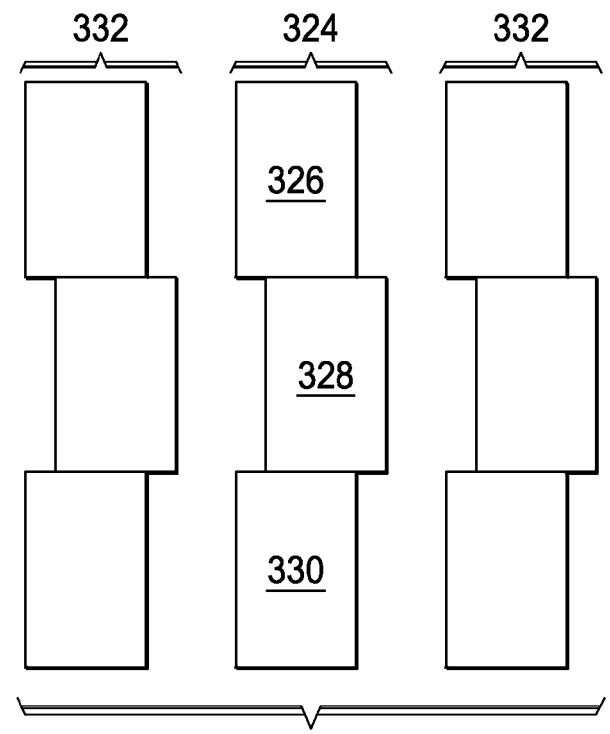

Referring to FIG. 3D, a layout for a first sinusoidal line (324) includes a first rectangle (326), a second rectangle (328) and a third rectangle (330). A lateral offset between the first rectangle (326) and the second rectangle (328) is opposite a lateral offset between the second rectangle (328) and the third rectangle (330), to produce a desired sinusoidal shape. The first sinusoidal line (324) is also flanked by adjacent sinusoidal lines (332) that reproduce dense circuit features in IC layouts. In a preferred embodiment, a layout of 2D test patterns includes sets of sinusoidal lines with a variety of sinusoidal shapes that comprehend a range of sinusoidal shapes found in IC layouts, as well as a variety of linewidths and separations between adjacent lines. Furthermore, sinusoidal and straight adjacent lines are included in separate layouts for sinusoidal lines. Comparing measured contours of photoresist and etched structure of sinusoidal lines from a preferred embodiment of a layout of 2D test patterns enables a computer program to generate the scalable OPC model to predict contours for any sinusoidal line with a sinusoidal shape comprehended in the range of sinusoidal shapes in the layout of 2D test patterns.

Figure 3E:
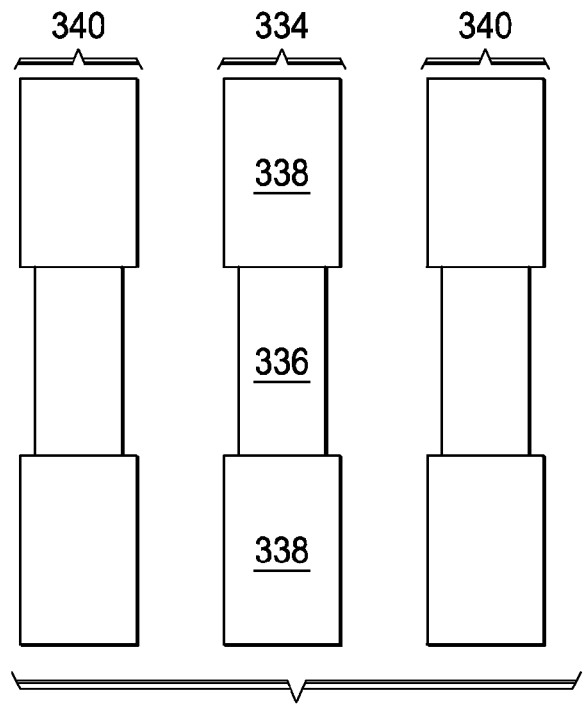

Referring to FIG. 3E, a layout for a first symmetric necked line (334) includes a narrow rectangle (336) symmetrically positioned between two wide rectangles (338). The first symmetric necked line is flanked by adjacent symmetric necked lines (340) that reproduce dense circuit features in IC layouts. In a preferred embodiment, a layout of 2D test patterns includes sets of symmetric necked lines with a variety of neck widths that comprehend a range of neck widths found in IC layouts, as well as a variety of linewidths and separations between adjacent lines. Furthermore, necked and unnecked adjacent lines are included in separate layouts for necked lines. Comparing measured contours of photoresist and etched structure of necked lines from a preferred embodiment of a layout of 2D test patterns enables a computer program to generate the scalable OPC model to predict contours for any necked line with a neck width comprehended in the range of neck widths in the layout of 2D test patterns.

Figure 3F:
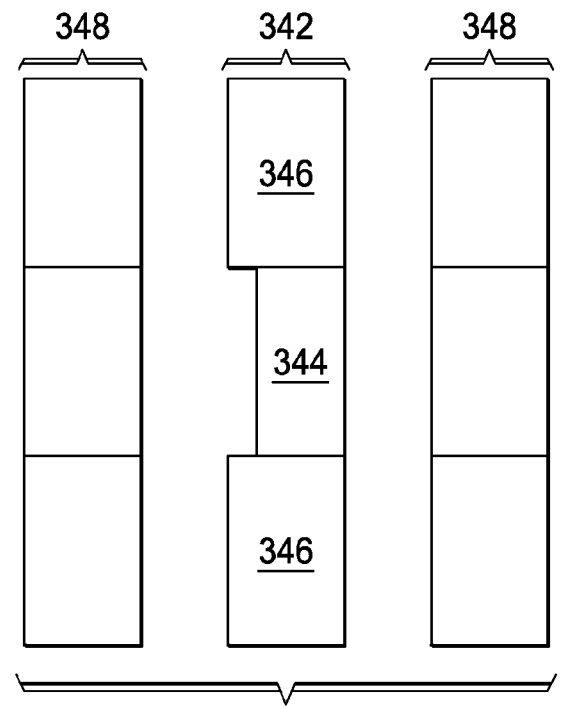

Referring to FIG. 3F, a layout for a first asymmetrically necked line (342) includes a narrow rectangle (344) positioned between two wide rectangles (346) with a lateral offset. The first necked line is flanked by adjacent lines (348) that reproduce dense circuit features in IC layouts. In a preferred embodiment, a layout of 2D test patterns includes sets of necked lines with a variety of neck widths that comprehend a range of neck widths found in IC layouts, as well as a variety of linewidths and separations between adjacent lines. Furthermore, asymmetrically necked and unnecked adjacent lines are included in separate layouts for asymmetrically necked lines. Comparing measured contours of photoresist and etched structure of asymmetrically necked lines from a preferred embodiment of a layout of 2D test patterns enables a computer program to generate the scalable OPC model to predict contours for any asymmetrically necked line with a neck width comprehended in the range of neck widths in the layout of 2D test patterns.

Figure 3G:
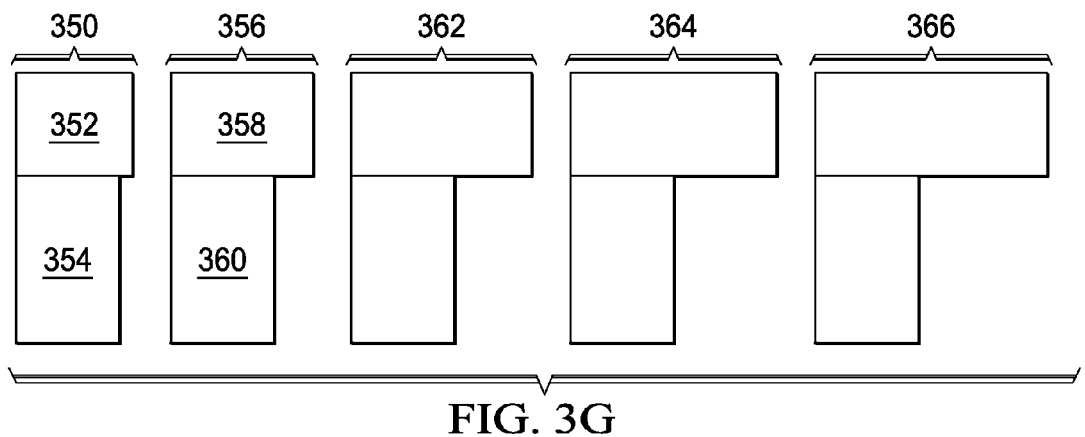

FIG. 3G depicts a layout of right angle lines including horizontal legs of varying length. A first right angle line (350)

includes a first horizontal leg (352) which extends a single resolution element past a first vertical leg (354). A second right angle line (356) includes a second horizontal leg (358) which extends several resolution elements past a second vertical leg (360). Additional right angle lines (362, 364, 366) include horizontal legs of increasing extension lengths. In a preferred embodiment, a layout of 2D test patterns includes sets of right angle lines with a variety of leg extension lengths that comprehend a range of leg extension lengths found in IC layouts, as well as a variety of leg linewidths and separations between adjacent structures. Comparing measured contours of photoresist and etched structure of right angle lines from a preferred embodiment of a layout of 2D test patterns enables a computer program to generate the scalable OPC model to predict contours for any right angle line with a leg extension length comprehended in the range of leg extension lengths in the layout of 2D test patterns.

Figure 3H:
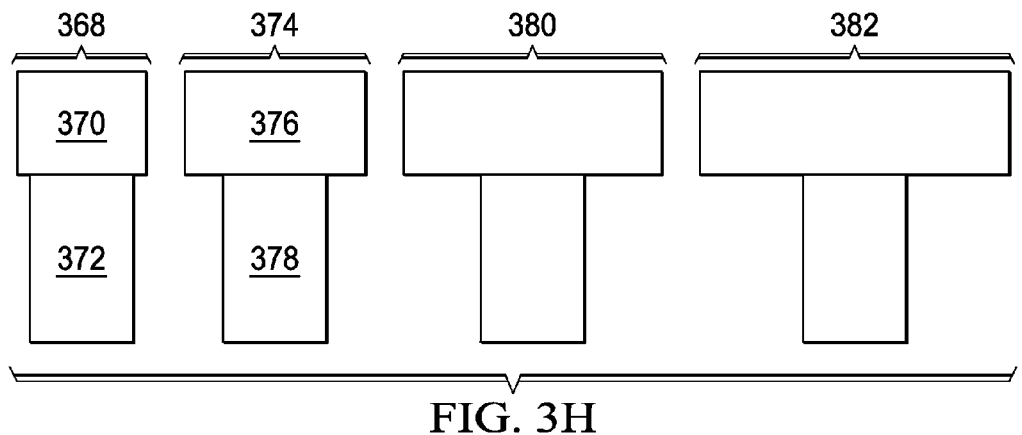

FIG. 3H depicts a layout of tee structures including cross-members of varying length. A tee structure (368) includes a cross-member (370) which extends a single resolution element on each side past a first intersecting member (372). A second tee structure (374) includes a second cross-member (376) which extends several resolution elements on each side past a second intersecting member (378). Additional tee structures (380, 382) include cross-members of increasing extension lengths. In a preferred embodiment, a layout of 2D test patterns includes sets of tee structures with a variety of cross-member lengths that comprehend a range of cross-member lengths found in IC layouts, as well as a variety of cross-member and intersecting member linewidths and separations between adjacent structures. Comparing measured contours of photoresist and etched structure of tee structures from a preferred embodiment of a layout of 2D test patterns enables a computer program to generate the scalable OPC model to predict contours for any tee structure with a cross-member extension length comprehended in the range of cross-member extension lengths in the layout of 2D test patterns.

The examples of layouts of 2D test patterns depicted in FIG. 3A through FIG. 3H are provided as examples to illustrate the concept of 2D test patterns which span a range of features found in an IC layout. The examples are not a comprehensive set of test patterns. Other common IC layout features have not been discussed here, in the interest of brevity and clarity. Practitioners of reticle pattern generation will also recognize that a comprehensive set of test patterns will include identical structures oriented both horizontally and vertically, to account for orientation differences in photolithographic processes.

The use of 2D test patterns exemplified in FIG. 3A through FIG. 3H is advantageous because the scalable OPC model is enabled to generate reticle pattern elements which will produce photoresist patterns and etched structures which correspond more closely to desired contours of IC layout features.

Figure 4:
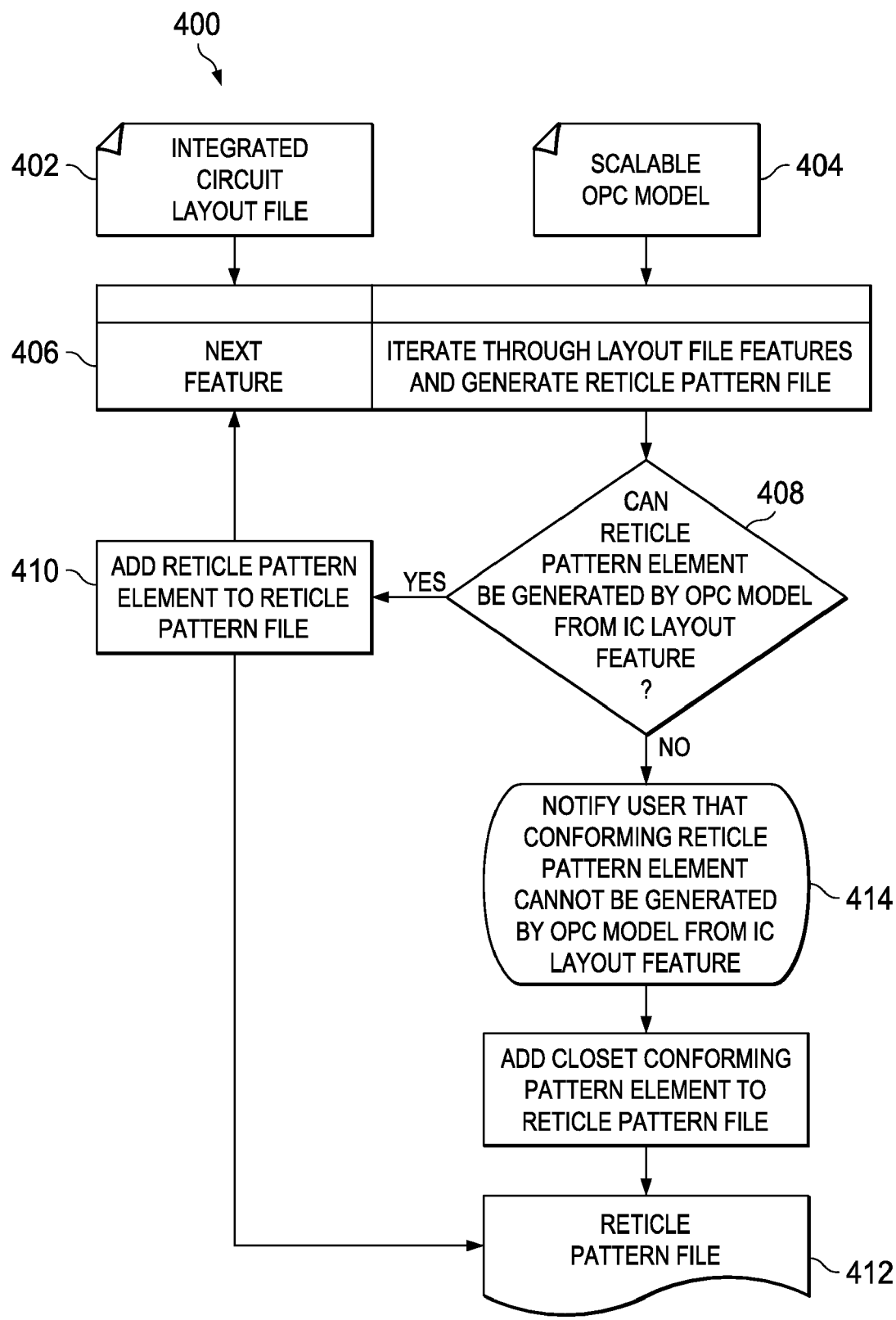
FIG. 4 is a flowchart (400) of a process of generating a reticle pattern file from an IC layout which includes a capability of identifying features in an IC layout for which reticle pattern elements cannot be generated by the scalable OPC model which meet conformance criteria of a given photolithographic process.

FIG. 4 is a flowchart (400) of a process of generating a reticle pattern file from an IC layout which includes a capability of identifying features in an IC layout for which reticle pattern elements cannot be generated by the scalable OPC model which meet conformance criteria of a given photolithographic process. An IC layout file (402) and a scalable OPC model (404), which has been generated according to the instant invention, are inputs for an iterative process (406) which sequentially reads each feature of the IC layout file, and attempts to generate a reticle pattern element corresponding to the feature. A decision operation (408) determines if the reticle pattern element can be generated by the OPC model for the IC layout feature currently being interrogated. If the reticle pattern element which meets a photolithographic conformance criterion can be generated, the reticle pattern element is generated using known methods (410) and is added to a reticle pattern file (412). If the reticle pattern element meeting the photolithographic conformance criterion cannot be generated, a user is notified (414) that the reticle pattern element cannot be generated by the OPC model from the IC layout feature, and optionally, a closest possible conforming pattern element is added to the reticle file. In an alternate embodiment, the process may continue reading features of the IC layout file, so as to generate a complete reticle pattern file with as many elements as possible, and generate a list of features corresponding to reticle pattern elements which do not meet the photolithographic conformance criteria.

What is claimed is:

1. A method of forming an integrated circuit (IC), the method comprising the steps of:
   generating scalable two-dimensional (2D) optical proximity correction (OPC) model, including the steps of:
      laying out 2D test patterns of basic features occurring in IC layouts, wherein the 2D test pattern includes:
         a set of sloped lines with a plurality of slope angles;
         a set of curved lines with a plurality of curvatures;
         a set of necked lines with a plurality of neck widths;
         a set of right angle lines with a plurality of leg extension lengths; and
         a set of tee structures with a plurality of cross-member extension lengths; and
      generating the OPC model from measured contours of printed and etched features of the 2D test patterns;
   generating a reticle pattern file using the scalable 2D OPC model;
   generating a reticle using the reticle pattern file; and
   forming an IC using the reticle.

2. The method of claim 1, in which the 2D test patterns include a range of feature dimensions spanning a range of feature dimensions occurring in IC layouts for which the scalable OPC model will be applied for generating reticle pattern files.

3. The method of claim 2, in which:
   a first member of the set of sloped lines is flanked by a first set of adjacent sloped lines which have a slope angle equal to a slope angle of the first member of the set of sloped lines;
   a first member of the set of curved lines is flanked by a first set of adjacent curved lines which have a curvature equal to a curvature of the first member of the set of curved lines; and
   a first member of the set of necked lines is flanked by a first set of adjacent necked lines which have a neck width equal to a neck width of the first member of the set of necked lines.

4. The method of claim 3, in which:
   a second member of the set of sloped lines is flanked by a second set of adjacent sloped lines which have a slope angle equal to a slope angle of the second member of the set of sloped lines and which are separated from the second member of the set of sloped lines by a different distance than a distance by which the first set of adjacent sloped lines is separated from the first member of the set of sloped lines;
   a second member of the set of curved lines is flanked by a second set of adjacent curved lines which have a curvature equal to a curvature of the second member of the set of curved lines and which are separated from the second member of the set of curved lines by a different distance than a distance by which the first set of adjacent curved lines is separated from the first member of the set of curved lines; and a second member of the set of necked lines is flanked by a second set of adjacent necked lines which have a neck width equal to a neck width of the second member of the set of necked lines and which are separated from the second member of the set of necked lines by a different distance than a distance by which the first set of adjacent necked lines is separated from the first member of the set of necked lines.

5. The method of claim 4, further comprising the step of measuring the printed and etched features by scanning electron microscopy (SEM) to generate the measured contours.

6. The method of claim 4, further comprising the step of measuring the printed and etched features by atomic force microscopy (AFM) to generate the measured contours.

7. A method of forming a reticle for an IC, the method comprising the steps of:
   laying out 2D test patterns of basic features occurring in IC layouts, wherein the 2D test pattern includes:
      a set of sloped lines with a plurality of slope angles;
      a set of curved lines with a plurality of curvatures;
      a set of necked lines with a plurality of neck widths;
      a set of right angle lines with a plurality of leg extension lengths; and
      a set of tee structures with a plurality of cross-member extension lengths;
   generating a scalable OPC model from measured contours of printed and etched features of the 2D test patterns;
   applying the scalable OPC model sequentially to layout features of the IC; and
   generating reticle pattern elements corresponding to the layout features.

8. The method of claim 7, in which the 2D test patterns include a range of feature dimensions spanning a range of feature dimensions occurring in IC layouts for which the scalable OPC model will be applied for generating reticle pattern files.

9. The method of claim 8, in which:
   a first member of the set of sloped lines is flanked by a first set of adjacent sloped lines which have a slope angle equal to a slope angle of the first member of the set of sloped lines;
   a first member of the set of curved lines is flanked by a first set of adjacent curved lines which have a curvature equal to a curvature of the first member of the set of curved lines; and
   a first member of the set of necked lines is flanked by a first set of adjacent necked lines which have a neck width equal to a neck width of the first member of the set of necked lines.

10. The method of claim 9, in which:
   a second member of the set of sloped lines is flanked by a second set of adjacent sloped lines which have a slope angle equal to a slope angle of the second member of the set of sloped lines and which are separated from the second member of the set of sloped lines by a different distance than a distance by which the first set of adjacent sloped lines is separated from the first member of the set of sloped lines;
   a second member of the set of curved lines is flanked by a second set of adjacent curved lines which have a curvature equal to a curvature of the second member of the set of curved lines and which are separated from the second member of the set of curved lines by a different distance than a distance by which the first set of adjacent curved lines is separated from the first member of the set of curved lines; and
   a second member of the set of necked lines is flanked by a second set of adjacent necked lines which have a neck width equal to a neck width of the second member of the set of necked lines and which are separated from the second member of the set of necked lines by a different distance than a distance by which the first set of adjacent necked lines is separated from the first member of the set of necked lines.

11. The method of claim 10, further comprising the step of identifying a layout feature, if existent, of the IC for which a reticle pattern element cannot be generated using the scalable OPC model.

12. The method of claim 11, further comprising the step of measuring the printed and etched features by scanning electron microscopy (SEM) to generate the measured contours.

13. A method of checking an IC layout, the method comprising the steps of:
   laying out 2D test patterns of basic features occurring in IC layouts, wherein the 2D test pattern includes:
      a set of sloped lines with a plurality of slope angles;
      a set of curved lines with a plurality of curvatures;
      a set of necked lines with a plurality of neck widths;
      a set of right angle lines with a plurality of leg extension lengths; and
      a set of tee structures with a plurality of cross-member extension lengths;
   generating a scalable OPC model from measured contours of printed and etched features of the 2D test patterns;
   applying the scalable OPC model sequentially to layout features of the IC;
   generating reticle pattern elements corresponding to the layout features; and
   identifying a layout feature, if existent, of the IC for which a reticle pattern element cannot be generated using the scalable OPC model.

14. The method of claim 13, in which the 2D test patterns include a range of feature dimensions spanning a range of feature dimensions occurring in IC layouts for which the scalable OPC model will be applied for generating reticle pattern files.

15. The method of claim 14, in which:
   a first member of the set of sloped lines is flanked by a first set of adjacent sloped lines which have a slope angle equal to a slope angle of the first member of the set of sloped lines;
   a first member of the set of curved lines is flanked by a first set of adjacent curved lines which have a curvature equal to a curvature of the first member of the set of curved lines; and
   a first member of the set of necked lines is flanked by a first set of adjacent necked lines which have a neck width equal to a neck width of the first member of the set of necked lines.

16. The method of claim 15, in which:
   a second member of the set of sloped lines is flanked by a second set of adjacent sloped lines which have a slope angle equal to a slope angle of the second member of the set of sloped lines and which are separated from the second member of the set of sloped lines by a different distance than a distance by which the first set of adjacent sloped lines is separated from the first member of the set of sloped lines;
   a second member of the set of curved lines is flanked by a second set of adjacent curved lines which have a curvature equal to a curvature of the second member of the set of curved lines and which are separated from the second member of the set of curved lines by a different distance than a distance by which the first set of adjacent curved lines is separated from the first member of the set of curved lines; and a second member of the set of necked lines is flanked by a second set of adjacent necked lines which have a neck width equal to a neck width of the second member of the set of necked lines and which are separated from the second member of the set of necked lines by a different distance than a distance by which the first set of adjacent necked lines is separated from the first member of the set of necked lines.

17. The method of claim 16, further comprising the step of measuring the printed and etched features by scanning electron microscopy (SEM) to generate the measured contours.

* * * * *